United States Patent
Auranen et al.

(10) Patent No.: US 7,336,730 B2
(45) Date of Patent: Feb. 26, 2008

(54) IQ-IMBALANCE

(75) Inventors: Tommi Auranen, Turku (FI); Juha Kajava, Naantali (FI)

(73) Assignee: Nokia Corporation, Espoo (FI)

( * ) Notice: Subject to any disclaimer, the term of this patent is extended or adjusted under 35 U.S.C. 154(b) by 657 days.

(21) Appl. No.: 10/482,254

(22) PCT Filed: Jun. 25, 2002

(86) PCT No.: PCT/FI02/00555

§ 371 (c)(1),
(2), (4) Date: Dec. 23, 2003

(87) PCT Pub. No.: WO03/003686

PCT Pub. Date: Jan. 9, 2003

(65) Prior Publication Data

US 2004/0156450 A1    Aug. 12, 2004

(30) Foreign Application Priority Data

Jun. 29, 2001  (FI) ................................. 20011426

(51) Int. Cl.
*H03K 9/00* (2006.01)
(52) U.S. Cl. .................................................. 375/316
(58) Field of Classification Search ................ 375/298, 375/316, 285, 322, 260, 345; 455/296, 324, 455/255, 326, 334, 337
See application file for complete search history.

(56) References Cited

U.S. PATENT DOCUMENTS 5,003,621 A    3/1991  Gailus 6,009,317 A * 12/1999  Wynn ........................... 455/296
6,208,698 B1 *  3/2001  Marchesani et al. ......... 375/298
6,377,620 B1 *  4/2002  Ozluturk et al. ............. 375/235
6,490,326 B1 * 12/2002  Bastani et al. ............... 375/317
7,016,426 B1 *  3/2006  Balz et al. ................... 375/261
7,061,994 B2 *  6/2006  Li et al. ....................... 375/316

FOREIGN PATENT DOCUMENTS

JP    08-163192    6/1996

OTHER PUBLICATIONS

Mu Hequiang, Peng Yingning; *An Approach to the Correction of I and Q Imbalance in Time Domain*; 2001; pp. 1006-1010; IEEE; 0-7803-7000-7/01.

(Continued)

*Primary Examiner*—Khanh C. Tran
(74) *Attorney, Agent, or Firm*—Alston & Bird LLP

(57) ABSTRACT

The invention relates to a method for correcting an IQ-imbalance (In-phase and Quadrature) of an IQ-based direct conversion receiver (200). In the method a group of radio frequency pilot signals are received in the direct conversion receiver (200). They are conveyed to an in-phase branch and a quadrature-phase branch of the receiver (200) and mixed, in the analogue domain, to form a baseband in-phase (I) and quadrature-phase (Q) signal components. The signal componets are conveyed to a digital demodulator (210) which detects the IQ-phase imbalance of the direct conversion receiver (200) by analysing at least one of the baseband in-phase (I) and the quadrature-phase (Q) signal components. In the method, the detected IQ-imbalance is corrected, in the analogue domain of the direct conversion receiver (200), to achieve a 90 degrees phase difference between a future baseband in-phase (I) signal component and a future baseband quadrature-phase (Q) signal component.

15 Claims, 5 Drawing Sheets

OTHER PUBLICATIONS

Chia-Liang Liu; *Impacts of I/Q Imbalance on QPSK-OFDM-QAM Detection*; 1998; pp. 984-989; IEEE: Transactions on Consumer Electronics, vol. 44, No. 3.

Andreas Schuchert, Ralph Hasholzner, Patrick Antoine; *A Novel IQ Imbalance Compensation Scheme for the Reception of OFDM Signals*; 2001; pp. 313-318; IEEE Transactions on Consumer Electronics, vol. 47, No. 3.

Vincent K.-P, Ma and Tommi Ylamurto; *Analysis of IQ Imbalance on Initial Frequency Offset Estimation in Direct Down-Conversion Receivers*; 2001; pp. 158-161; IEEE; 0-7803-6720-0/01.

*Digital Video Broadcasting (DVB); Framing Structure, Channel Coding and Modulation for Digital Terrestrial Television*; European Standard; Jan. 2001; 49 pages; *ETSI EN 300 744 V1.4.1;European Broadcasting Union*.

* cited by examiner

IQ-IMBALANCE

The invention relates to correcting IQ-imbalance (In-phase and Quadrature) of a direct conversion receiver.

Digital broadcasting systems, such as digital television systems, are under development, and it is intended that, eventually, they will replace analogue broadcasting systems. This is, among other things, because of their ability to provide new types of services and better quality of service capabilities compared to the analogue broadcasting systems.

One of the digital broadcasting systems currently being under standardisation by the European Telecommunications Standards Institute (ETSI) is the Digital Video Broadcasting (DVB) system. In the DVB system digital video is broadcast using satellite, cable and/or terrestrial infrastructures.

The DVB system using terrestrial infrastructure is defined as the DVB-T (DVB-Terrestrial) system. In DVB-T transmission digital data is modulated onto a radio frequency (RF) signal. The modulation method used is the COFDM (Coded Orthogonal Frequency Division Multiplex) modulation. The modulated DVB-T signal is transmitted from a DVB-T transmitter. The transmission occurs over a DVB-T radio channel. The transmitted DVB-T signal is received at a DVB-T receiver. The DVB-T receiver demodulates the received DVB-T signal in order to regenerate the digital data. The digital data may contain, for example, an MPEG-2 (Moving Picture Experts Group) coded video stream.

With terrestrial digital video broadcasting it is possible to achieve a good quality data transfer even if the DVB-T receiver is mobile.

Wireless mobile communication devices are expected to be lightweight and small-sized. That is why the use of a direct conversion architecture in the DVB-T receiver is in many cases more desirable than, for example, the use of a superheterodyne architecture.

In a direct conversion receiver a radio frequency analogue DVB-T signal, transmitted from a DVB-T transmitter and received at a DVB-T receiver, is converted directly from the radio frequency band to baseband I- and Q-signal components in the DVB-T receiver, in which "I" refers to an in-phase signal component of the DVB-T signal and "Q" refers to a quadrature-phase signal component of the DVB-T signal. In practise, the conversion is performed by splitting the received radio frequency DVB-T signal into two substantially identical signals, mixing one of the signals with a local oscillator signal to form the baseband I-signal component and mixing the other of the signals with a phase shifted local oscillator signal to form the baseband Q-signal component. The phase shifting of the local oscillator signal is performed in a phase shifter the amount of the phase shift being 90 degrees. The phase difference between the signals of an I-branch along which the I-signal component travels in the DVB-T receiver and a Q-branch along which the Q-signal component travels in the DVB-T receiver is thus exactly 90 degrees in an ideal case.

The COFDM modulation method that is used in the DVB-T system is a multicarrier modulation method. This means that, in the DVB-T transmitter, digital data to be transmitted is split into several components which are transmitted over separate carrier signals. In one of the operational modes of the DVB-T system, for example, a DVB-T channel (the bandwidth of which is 8 Mhz) contains 6816 carriers (also referred to as "subcarriers"). The carriers themselves are modulated using different level QAM (Quadrature Amplitude Modulation) constellations.

FIG. 1 shows a constellation diagram showing 64-QAM constellation points. The horizontal axis, that is the I-axis, indicates the amplitude of the I-signal component of the DVB-T signal and the vertical axis, that is the Q-axis, indicates the amplitude of the Q-signal component of the DVB-T signal. In FIG. 1, the units of the I-axis and the Q-axis are arbitrary units. The I-axis and the Q-axis define an IQ-plane. Each constellation point in the IQ-plane corresponds to a transmitted bit sequence. The constellation point (I=3,Q=5), for example, corresponds to a transmitted bit sequence 001011.

It is important that the phase difference between the signals of the I-branch and the Q-branch is 90 degrees because if it differs from 90 degrees there exists IQ-imbalance (more particularly IQ-phase imbalance), and the probability that the transmitted bits are not detected correctly in the DVB-T receiver rises. The more complex QAM modulation is used the more sensitive the bit detection is to the IQ-imbalance.

The DVB-T system is a broadband system using a large variety of frequencies. If, for example, the UHF (UltraHigh Frequency) band is used with a channel width of 8 MHz, the used frequency band reaches from 470 MHz to 862 MHz. It is difficult and expensive to manufacture a phase shifter that would perform a stable 90 degrees phase difference for the I- and Q-branches in the whole region of the used frequency band, especially taking into consideration the small size requirement of the wireless mobile communication devices.

According to a first aspect of the invention there is provided a method for correcting an IQ-imbalance of an IQ-based direct conversion receiver the method comprising:

receiving a radio frequency signal in the direct conversion receiver;

conveying, in an analogue domain of the direct conversion receiver, the received radio frequency signal to an in-phase branch of the direct conversion receiver and to a quadrature-phase branch of the direct conversion receiver;

mixing, in the analogue domain of the direct conversion receiver, the radio frequency signal of the in-phase branch with a first mixing signal to form a baseband in-phase signal component and mixing the radio frequency signal of the quadrature-phase branch with a second mixing signal to form a baseband quadrature-phase signal component;

conveying the baseband in-phase signal component and the baseband quadrature-phase signal component to a digital demodulator;

detecting, in the digital demodulator, the IQ-imbalance of the direct conversion receiver by analysing at least one of the baseband in-phase and the quadrature-phase signal components;

correcting the IQ-imbalance, detected in the digital demodulator, in the analogue domain of the direct conversion receiver to achieve a 90 degrees phase difference between a future baseband in-phase signal component and a future baseband quadrature-phase signal component.

According to a second aspect of the invention there is provided an IQ-based direct conversion receiver for correcting an IQ-imbalance the direct conversion receiver comprising:

a radio frequency part for receiving a radio frequency signal in the direct conversion receiver;

an in-phase branch and a quadrature-phase branch, in an analogue domain of the direct conversion receiver, for conveying the received radio frequency signal in the in-phase branch and the quadrature-phase branch;

a first mixer for mixing, in the analogue domain of the direct conversion receiver, the radio frequency signal of the in-phase branch with a first mixing signal to form a baseband in-phase signal component and second mixer for mixing, in the analogue domain of the direct conversion receiver, the radio frequency signal of the quadrature-phase branch with a second mixing signal to form a baseband quadrature-phase signal component;

a digital demodulator adapted to receive the baseband in-phase signal component and the baseband quadrature-phase signal component, the digital demodulator being adapted to detect the IQ-imbalance of the direct conversion receiver by analysing at least one of the baseband in-phase and the quadrature-phase signal component;

means for correcting the IQ-imbalance, detected in the digital demodulator, in the analogue domain of the direct conversion receiver to achieve a 90 degrees phase difference between a future baseband in-phase signal component and a future baseband quadrature-phase signal component.

According to a third aspect of the invention there is provided a communication device comprising an IQ-based direct conversion receiver for correcting an IQ-imbalance the direct conversion receiver comprising:

a radio frequency part for receiving a radio frequency signal in the direct conversion receiver;

an in-phase branch and a quadrature-phase branch, in an analogue domain of the direct conversion receiver, for conveying the received radio frequency signal in the in-phase branch and the quadrature-phase branch;

a first mixer for mixing, in the analogue domain of the direct conversion receiver, the radio frequency signal of the in-phase branch with a first mixing signal to form a baseband in-phase signal component and second mixer for mixing, in the analogue domain of the direct conversion receiver, the radio frequency signal of the quadrature-phase branch with a second mixing signal to form a baseband quadrature-phase signal component;

a digital demodulator adapted to receive the baseband in-phase signal component and the baseband quadrature-phase signal component, the digital demodulator being adapted to detect the IQ-imbalance of the direct conversion receiver by analysing at least one of the baseband in-phase and the quadrature-phase signal component;

means for correcting the IQ-imbalance, detected in the digital demodulator, in the analogue domain of the direct conversion receiver to achieve a 90 degrees phase difference between a future baseband in-phase signal component and a future baseband quadrature-phase signal component.

According to a fourth aspect of the invention there is provided a system comprising a transmitter and an IQ-based direct conversion receiver for correcting an IQ-imbalance, the transmitter comprising a modulator for transmitting a radio frequency signal to the direct conversion receiver the direct conversion receiver comprising:

a radio frequency part for receiving the radio frequency signal in the direct conversion receiver;

an in-phase branch and a quadrature-phase branch, in an analogue domain of the direct conversion receiver, for conveying the received radio frequency signal in the in-phase branch and the quadrature-phase branch;

a first mixer for mixing, in the analogue domain of the direct conversion receiver, the radio frequency signal of the in-phase branch with a first mixing signal to form a baseband in-phase signal component and second mixer for mixing, in the analogue domain of the direct conversion receiver, the radio frequency signal of the quadrature-phase branch with a second mixing signal to form a baseband quadrature-phase signal component;

a digital demodulator adapted to receive the baseband in-phase signal component and the baseband quadrature-phase signal component, the digital demodulator being adapted to detect the IQ-imbalance of the direct conversion receiver by analysing at least one of the baseband in-phase and the quadrature-phase signal component;

means for correcting the IQ-imbalance, detected in the digital demodulator, in the analogue domain of the direct conversion receiver to achieve a 90 degrees phase difference between a future baseband in-phase signal component and a future baseband quadrature-phase signal component.

Embodiments of the invention will now be described by way of example with reference to the accompanying drawings in which.

Figure 1:
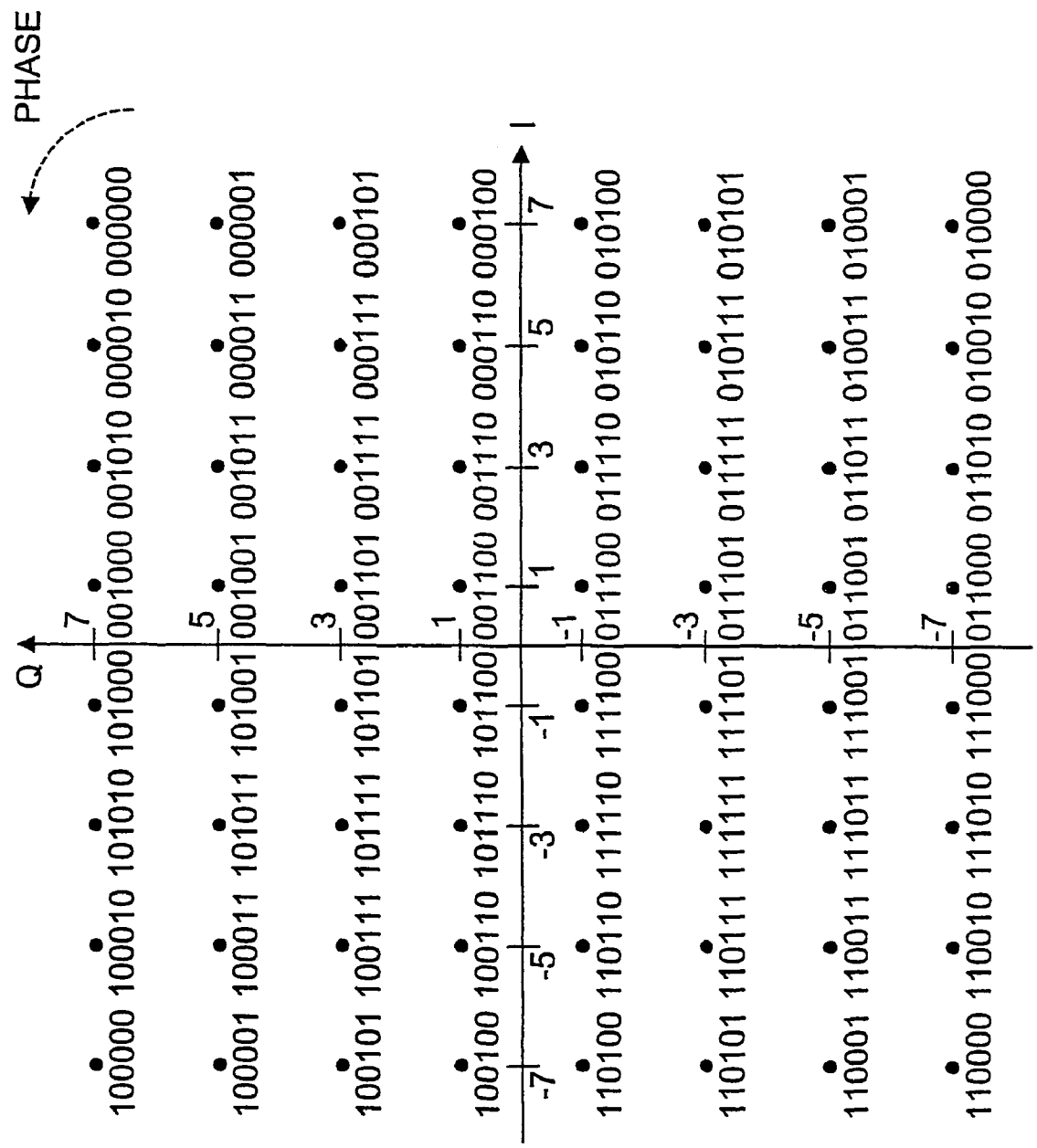
FIG. 1 shows a constellation diagram showing 64-QAM constellation points.

The FIG. 1 has already been described in the foregoing.

In the following, a DVB-T system, according to a preferred embodiment, will be described. The system comprises a DVB-T transmitter and a DVB-T receiver. The DVB-T transmitter functions in a manner known to a person skilled in the art. It comprises a COFDM modulator for modulating digital data to be broadcast to the DVB-T receiver.

Figure 2:
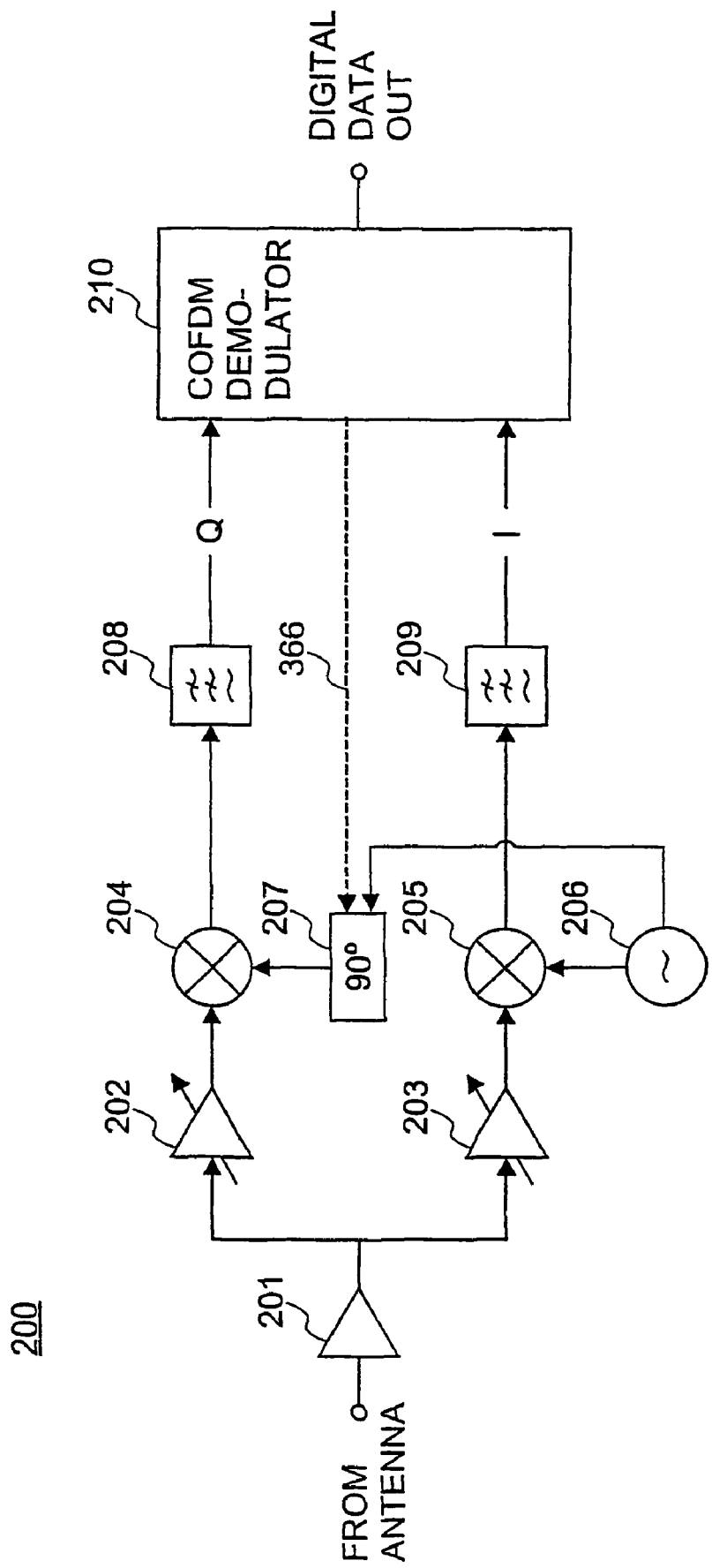
FIG. 2 shows the functional blocks of a DVB-T receiver according to a preferred embodiment of the invention.

FIG. 2 shows the DVB-T (broadband) receiver according to the preferred embodiment of the invention. The DVB-T receiver 200 is located in a mobile communication device so as to form a portable wireless hand-held device suitable for DVB-T operation. In addition to the DVB-T receiving capability the mobile communication device may have a cellular network capability in order to perform interactive communication with a cellular network such as a cellular telephone network. The device may be called a media terminal or a media screen.

The DVB-T receiver 200 functions generally according to a well known direct conversion principle.

In the preferred embodiment of the invention, digital data which has been COFDM modulated into an analogue radio frequency DVB-T signal and which has been sent from a DVB-T transmitter and received via an integral antenna (not shown) of the DVB-T receiver 200 is conveyed to a low noise amplifier 201 of the DVB-T receiver 200. In the low noise amplifier 201 the DVB-T signal is amplified in order to raise the power level of the received DVB-T signal.

The amplified DVB-T signal is split into two substantially identical signals one of which is conveyed to a first adjustable amplifier 202 and the other of which is conveyed to a second adjustable amplifier 203. The signal branch along which the first adjustable amplifier 202 resides is called a Q-branch and the signal branch along which the second adjustable amplifier 203 resides is called an I-branch.

The first adjustable amplifier 202 amplifies the signal travelling along the Q-branch and the second adjustable amplifier 203 amplifies the signal travelling along the I-branch. In the Q-branch the amplified signal is conveyed to a first input of a first down conversion mixer 204 and in the I-branch the amplified signal is conveyed to a first input of a second down conversion mixer 205.

A local oscillator 206 generates a local oscillator signal. The local oscillator signal is conveyed to a second input of the second down conversion mixer 205. Additionally, the local oscillator signal is conveyed to an adjustable phase shifter 207 which shifts the phase of the local oscillator signal by 90 degrees. The phase shifted local oscillator signal is conveyed to a second input of the first down conversion mixer 204.

The first down conversion mixer 204 mixes the Q-branch signal coming from the first adjustable amplifier 202 with the phase shifted local oscillator signal in order to generate a baseband Q-signal component. The baseband Q-signal component is conveyed to a first low pass filter 208 which low pass filters the baseband Q-signal component of the DVB-T signal. The first low pass filter 208 is a low pass filter of a fixed pass band, the width of which is substantially the same as the width of one DVB-T channel divided by two. The pass band of the first low pass filter 208 has steep edges so as to strongly attenuate the frequency components that lie outside the pass band. From the first low pass filter 208 the Q-signal component is conveyed to a COFDM demodulator 210 for digital demodulation.

The second down conversion mixer 205 mixes the I-branch signal coming from the second adjustable amplifier 203 with the local oscillator signal in order to generate a baseband I-signal component. The baseband I-signal component is conveyed to a second low pass filter 209 which low pass filters the baseband I-signal component of the DVB-T signal. The second low pass filter 209 is a low pass filter of a fixed pass band, the width of which is substantially the same as the width of one DVB-T channel divided by two. The pass band of the second low pass filter 209 has steep edges so as to strongly attenuate the frequency components that lie outside the pass band. From the second low pass filter 209 the I-signal component is conveyed to the COFDM demodulator 210 for digital demodulation.

The COFDM demodulator 210 is a digital demodulator block which demodulates the received COFDM modulated DVB-T signal so as to regenerate the originally transmitted digital data. From the COFDM demodulator 210 the digital data may be conveyed, for example, to an MPEG-2 decoder, to an IP (Internet Protocol) stack or to another appropriate functional block for further processing.

Figure 3:
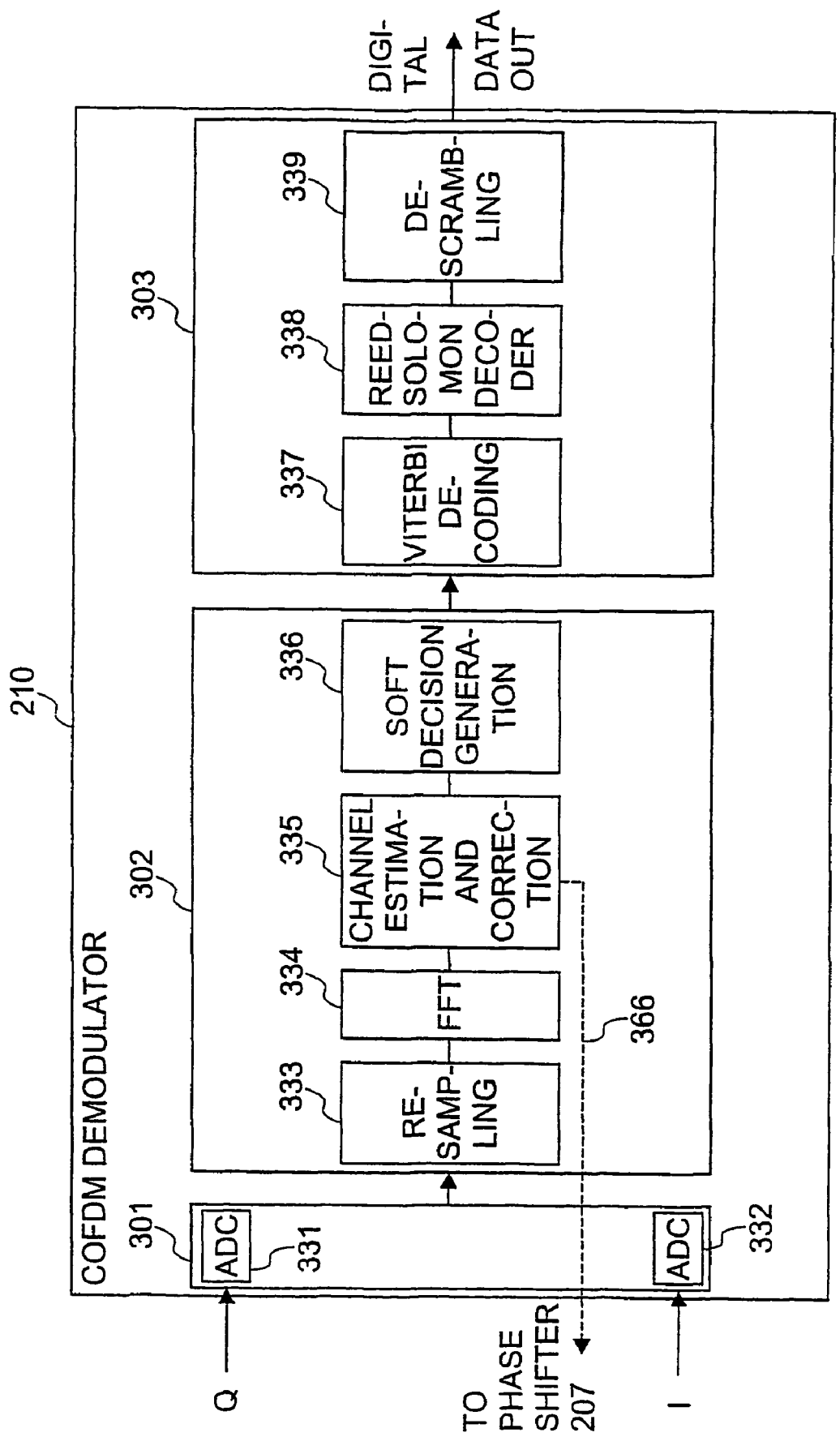
FIG. 3 shows a detail of the DVB-T receiver of FIG. 2.

FIG. 3 shows basic blocks of the COFDM demodulator 210. Those are an analogue signal processing block 301, an OFDM (Orthogonal Frequency Division Multiplex) demodulator block 302 and a FEC (Forward Error Correction) channel decoder 303.

A first analogue-to-digital converter 331 of the analogue signal processing block 301 converts the Q-signal component from analogue form to digital form. A second analogue-to-digital converter 332 of the analogue signal processing block 301 converts the I-signal component from analogue form to digital form.

The digital I- and Q-signal components are conveyed to the OFDM demodulator block 302 which performs resampling (in block 333) and Fast Fourier Transform (FFT, block 334) operations on the I- and Q-signal components in order to generate a frequency domain DVB-T signal. A channel estimation and correction block 335 of the OFDM demodulator block 302 determines, based on particular pilot signals comprised in the DVB-T signal, a transfer function H(f) of the DVB-T (receiving) channel in use, and based on the transfer function H(f), corrects the effects that the transmission path causes to the DVB-T signal. The OFDM demodulator block 302 finally generates (in block 336), based on the corrected DVB-T signal, soft decisions about the transmitted bits, that is it generates probabilities about the transmitted bits.

The soft decisions are conveyed to the FEC channel decoder 303 which performs a two-phase error correction. In the first phase a Viterbi decoder 337 derives based on the soft decisions, using redundancy inserted by a convolutional encoder of the DVB-T transmitter, the convolutional encoder input bit stream which most probably has been transmitted from the DVB-T transmitter. The derived bit stream is conveyed to a Reed-Solomon decoder 338. The Reed-Solomon decoder 338 performs the second phase of the error correction, that is the frame decoding. The frame decoded bit stream is conveyed to a descrambling block 339 which performs descrambling operations in order to regenerate the originally transmitted digital data.

It is apparent to a person skilled in the art that the blocks 301-303 may comprise sub-blocks other than shown in FIG. 3 those sub-blocks being apparent for a person skilled in the art. Block 301, for example, may contain an automatic gain control (AGC) for the received DVB-T signal. The AGC block may control with one or more AGC feedback control signals the gain of the first and second adjustable amplifiers 202 and 203 so as to optimise the received DVB-T signal voltage level for the analogue-to-digital conversion of the I- and Q-signal components. Block 303, for example, may contain additional blocks for performing deinterleaving operations.

In one implementation of the DVB-T receiver 200 the blocks 201 to 205 and 207 to 209 are implemented in one integrated circuit (IC) which may be called a direct conversion IC (or a radio frequency IC), the local oscillator 206 is implemented as a separate circuit component and the COFDM demodulator 210 is implemented in another integrated circuit which may be called a demodulator IC. The demodulator IC may have a digital signal processor (DSP) for signal processing.

In another implementation also the local oscillator 206 is integrated in the direct conversion IC.

According to the foregoing description, the channel estimation and correction block 335 of the OFDM demodulator block 302 determines, based on particular pilot signals, a transfer function H(f) of the DVB-T channel in use, and based on the transfer function H(f), corrects the effects that the transmission path causes to the DVB-T signal. The pilot signals are signals which are transmitted in the DVB-T signal, their transmission amplitudes and location in the spectrum being known, in advance, to the DVB-T receiver.

There are three different types of pilot signals in the DVB-T signal: continual pilot signals, scattered pilot signals and TPS (Transmitter Parameter Signalling) pilot signals. The pilot signals are modulated onto pilot carriers in the DVB-T transmitter and they form a part of the transmitted DVB-T signal. The COFDM modulated DVB-T signal thus comprises both data carriers (carriers carrying digital data) and pilot carriers (carriers carrying pilot signals). Since the pilot signals form a part of the DVB-T signal they are processed in a similar manner as the data carriers in the direct conversion IC.

In the demodulator IC the continual and scattered pilot signals are used in channel estimation and correction. In other words, the channel estimation and correction block 335 determines the transfer function H(f) based on these pilot signals and corrects the effects, that is distortion, that the transmission path causes to the DVB-T signal by multiplicating the DVB-T signal with a function 1/H(f) which is an inverse function to the determined transfer function H(f). TPS pilot signals are used for signalling particular transmitter parametres.

In addition to the estimation and correction of the transmission path effects the channel estimation and correction block 335 corrects in the preferred embodiment the IQ-imbalance (or more closely IQ-phase imbalance or in other words phase error) generated in the DVB-T receiver 200. As hinted in the foregoing, IQ-imbalance typically occurs if the phase shift that the adjustable phase shifter 207 performs for the local oscillator signal differs from 90 degrees. The phase difference of the I-signal component and the Q-signal component then, after the mixing, ends up being different from 90 degrees which, in turn, makes the detection of transmitted bits more difficult. IQ-imbalance may also occur if, for example, the propagation times in the I- and Q-branches differ from each other.

The adjustable phase shifter is typically frequency-dependent and is thus not able to perform a stable 90 degrees phase difference for the I- and Q-branches in the whole wide region of the used frequency band, and that is why the correction is needed. The IQ-imbalance correction performed by block 335 is needed for ensuring that the phase difference between the signals travelling along the I-branch and the Q-branch is as close to 90 degrees as possible in the frequency region of the DVB-T channel currently in use.

In the following, the IQ-imbalance correction is described in more detail. According to the preferred embodiment of the invention IQ-imbalance is detected from the pilot signals. A correction signal 366 is generated in the channel estimation and correction block 335 and it is fed back to the adjustable phase shifter 207 of the direct conversion IC.

Figure 4:
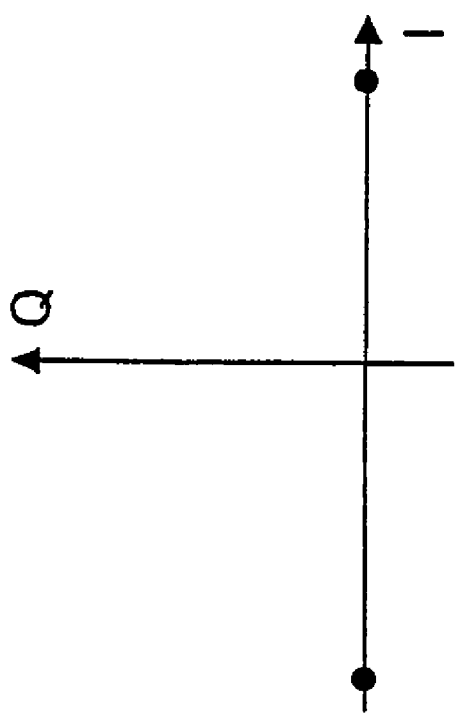
FIG. 4 shows a constellation diagram of 2-PSK modulation.

The modulation method that is used in all the pilot signals is 2-PSK (Phase Shift Keying). FIG. 4 shows a constellation diagram showing the constellation points of 2-PSK. It is seen that an ideal 2-PSK modulated signal does not have a Q-component at all, that is the Q-component is zero. If the Q-component of the received pilot signal is not zero there exists IQ-imbalance. The IQ-imbalance may caused by the transmission path, that is the radio channel itself, or by the DVB-T receiver or both.

In the preferred embodiment of the invention, the IQ-imbalance caused by the transmission path is eliminated by averaging. The IQ-imbalance caused by the transmission path is assumed to be thermal of its character. That is why the averaging eliminates the IQ-imbalance caused by the transmission path.

What is averaged depends on the implementation. In one implementation the Q-component of all the continual pilot signals during one received OFDM symbol (a particular bit sequence) is averaged. In another implementation the Q-component of both the continual and the scattered pilot signals is averaged. In yet another implementation the Q-component of both the continual and the scattered as well as the TPS pilot signals is averaged. In yet another implementation the Q-component of continual and/or scattered and/or TPS pilot signals of more than one OFDM symbol is averaged. The averaging may be performed to the Q-component residing on the right-hand side half plane of the IQ-plane or to the Q-component residing on the left-hand side half plane of the IQ-plane or both.

Independent of which of the implementations is used the averaged Q-component represents an estimate of IQ-imbalance generated in the DVB-T receiver 200 (typically most of the IQ-imbalance is generated due to the non-ideal operation of the adjustable phase shifter 207). As stated in the foregoing a correction signal 366 is generated in the channel estimation and correction block 335. The correction signal 366 is generated based on the averaged Q-component, that is the Q-component which remains after the averaging has been performed. The correction signal 366 which may, for example, be a DC voltage level is fed back from the digital domain (every block residing in the demodulator IC after the analogue-to-digital converters 331 and 332 belong to digital domain) to the analogue domain to the adjustable phase shifter 207. The phase shift of the adjustable phase shifter 207 is corrected with the correction signal 366. The purpose is to zero the averaged Q-component of the pilot signal because if the Q-component gets closer to zero it means that the phase difference between the signals travelling along the I- and Q-signal branch gets closer to 90 degrees, that is the IQ-imbalance is corrected or at least reduced in the frequency region of the used DVB-T channel.

The correction signal generation and the correction of the IQ-imbalance may occur iteratively all the time when the DVB-T receiver is receiving the DVB-T signal containing pilot signals.

Since the IQ-imbalance is according to the preferred embodiment completely corrected or at least reduced, the quality of the DVB-T signal reception may be improved. If the IQ-imbalance is very severe, for example, 5 degrees or more if the 64-QAM is used, it may be possible, after the correction, to correctly receive transmitted bits, which without the IQ-imbalance correction would have been wrongly received or would not have been received at all.

In another embodiment of the invention, instead of conveying the local oscillator signal to the second input of the second down conversion mixer 205, phase shifting the local oscillator signal in the adjustable phase shifter 207 and conveying the phase shifted oscillator signal to the second input of the first down conversion mixer 204, there are two local oscillators a local oscillator signal of a first local oscillator being conveyed to the second input of the first down conversion mixer 204 and a local oscillator signal of a second local oscillator being conveyed to the second input of the second down conversion mixer 205. A correction signal (or signals) is (are) generated in the channel estimation and correction block 335 and it (they) is (are) fed back to the analogue domain of the DVB-T receiver so as to correct the IQ-imbalance of the DVB-T receiver by adjusting the phase difference between the local oscillator signal of the first local oscillator and the local oscillator signal of the second local oscillator.

Figure 5:
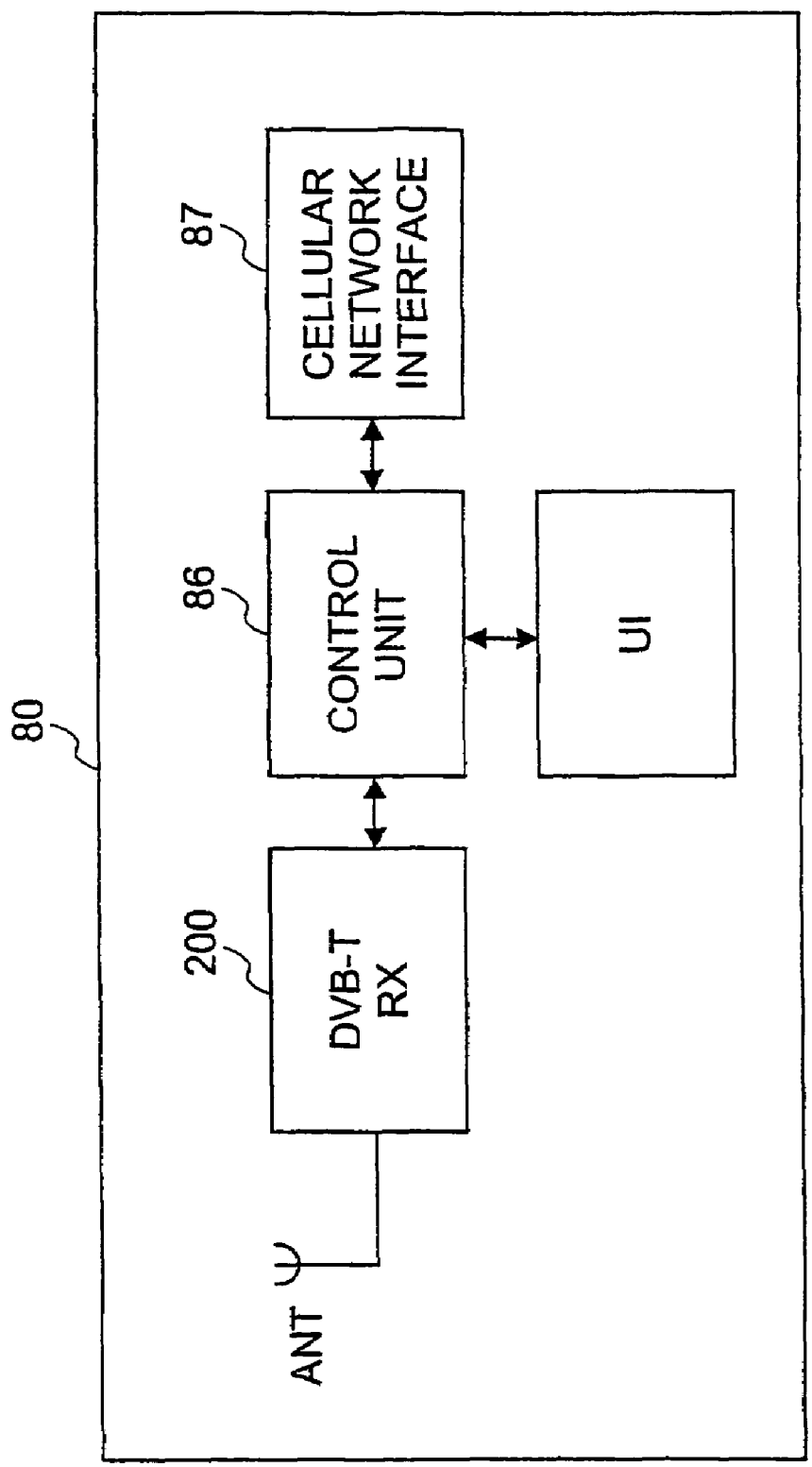
FIG. 5 shows a mobile communication device according to the invention.

FIG. 5 shows a mobile communication device 80, also referred to as a wireless media terminal, suitable for implementing the invention. The mobile communication device 80 comprises the DVB-T receiver 200 with an internal integrated antenna ANT, a user interface UI and a control unit 86. The DVB-T receiver 200 is coupled to the control unit 86 via a first control/data bus. The user interface UI is coupled to the control unit 86 via a second control/data bus. Additionally, for communication between the mobile communication device 80 and a cellular network (not shown), the mobile communication device may comprise a cellular network interface 87 which is coupled to the control unit 86 via a third control/data bus. The cellular network interface 87 may comprise a radio frequency transceiver (not shown).

The control unit 86 comprises a processor with a memory and software for controlling the operation of the mobile communication device 80. The software contains an MPEG-2 protocol stack for decoding the demodulated digital data which the DVB-T receiver 200 provides for the control unit 86 via the first control/data bus. The user interface UI comprises a display and a keyboard for enabling the user to use the mobile communication device 80. The control unit 86 controls the presentation of information on the user interface UI, for example the presentation of the decoded MPEG-2 digital data (video stream) on the display. The demodulated digital data may contain IP (Internet Protocol) packets of an IP datacast or multicast service. The software of the control unit 86 may contain an IP protocol stack to handle the IP packets.

If it is desired that the mobile communication device 80 is small-sized, the small-sized DVB-T direct conversion receiver 200, according to the preferred embodiment of the invention, helps, in many cases, to reduce the size of the mobile communication device 80.

The present invention enables IQ-imbalance correction in a direct conversion receiver. The IQ-imbalance is completely corrected or at least reduced already in the analogue domain with the aid of a correction signal generated in the digital demodulator 210 in the digital domain. When the IQ-imbalance is already corrected in the analogue domain no additional IQ-imbalance correction is needed in the digital domain (or even if an additional IQ-imbalance correction would still be performed in the digital domain the algorithms used in it can, in many cases, be made simpler).

By correcting the IQ-imbalance the signal acquisition may be performed more easily. When the IQ-imbalance is corrected according to the invention the probability that the constellation points of the complicated phase and amplitude sensitive QAM modulation, used in data carriers, are detected correctly, in the direct conversion receiver, may be improved. This means that also the transmitted digital data may be more accurately regenerated in the direct conversion receiver.

Although the DVB-T system has been used as an example the invention is applicable also in other OFDM multicarrier modulation based systems, such as the Japanese ISDB-T (Integrated Services Digital Broadcasting-Terrestrial) system. The invention is also applicable with appropriate changes in other wideband/broadband as well as narrowband systems in which IQ-modulation and pilot signals are used.

The invention is not restricted to mobile devices but it may also be used in a fixed DVB-T receiver. This may be present in a so-called set top box.

Particular implementations and embodiments of the invention have been described. It is clear to a person skilled in the art that the invention is not restricted to details of the embodiments presented above, but that it can be implemented in other embodiments using equivalent means without deviating from the characteristics of the invention. The scope of the invention is only restricted by the attached patent claims.

The invention claimed is:

1. A method for correcting an IQ-imbalance (In-phase and Quadrature) of an IQ-based direct conversion receiver the method comprising:

receiving a radio frequency signal in the direct conversion receiver, the radio frequency signal being received from an antenna;

conveying, in an analogue domain of the direct conversion receiver, the received radio frequency signal to an in-phase branch of the direct conversion receiver and to a quadrature-phase branch of the direct conversion receiver;

mixing, in the analogue domain of the direct conversion receiver, the radio frequency signal of the in-phase branch with a first mixing signal to form a baseband in-phase (I) signal component and mixing the radio frequency signal of the quadrature-phase branch with a second mixing signal to form a baseband quadrature-phase (Q) signal component;

conveying the baseband in-phase (I) signal component and the baseband quadrature-phase (Q) signal component to a digital demodulator;

detecting, in the digital demodulator, the IQ-imbalance of the direct conversion receiver by analysing at least one of the baseband in-phase (I) or quadrature-phase (Q) signal components;

correcting the IQ-imbalance, detected in the digital demodulator, in the analogue domain of the direct conversion receiver to achieve at least close to a 90 degrees phase difference between a future baseband in-phase signal component and a future baseband quadrature-phase signal component.

2. A method according to claim 1, wherein the received radio frequency signal comprises a group of pilot signals, the method comprising:

detecting the IQ-imbalance based on the group of pilot signals.

3. A method according to claim 2, wherein the method comprises:

detecting the IQ-imbalance by analysing at least one of the baseband in-phase (I) or quadrature-phase (Q) signal components of the group of pilot signals.

4. A method according to claim 2, wherein the method comprises:

averaging the baseband quadrature-phase (Q) signal component of the group of pilot signals;

detecting the IQ-imbalance by finding out whether the averaged baseband quadrature-phase (Q) signal component of the group of pilot signals has the value of zero.

5. A method according to claim 1, wherein the method comprises:

analogue-to-digital converting the baseband in-phase (I) signal component and the baseband quadrature-phase (Q) signal component to form a digital baseband in-phase signal component and a digital baseband quadrature-phase signal component;

detecting the IQ-imbalance of the direct conversion receiver by analysing at least one of the digital baseband in-phase or quadrature-phase signal components.

6. A method according to claim 1, wherein the first mixing signal is a local oscillator signal and the second mixing signal is a phase shifted local oscillator signal.

7. A method according to claim 1, wherein the second mixing signal is substantially in a 90 degrees phase shift compared to the first mixing signal.

8. A method according to claim 1, wherein the second mixing signal is generated from the first mixing signal by shifting the phase of the first mixing signal in an adjustable phase shifter.

9. A method according to claim 8, wherein the method comprises:

generating within the digital demodulator, based on the detected IQ-imbalance, a correction signal; and correcting the phase shift of the adjustable phase shifter with the aid of the correction signal so as to correct the IQ-imbalance of the direct conversion receiver.

10. A method according to claim 1, wherein the direct conversion receiver is a broadband receiver located in a mobile communication device so as to form a portable hand-held device.

11. A method according to claim 1, wherein the direct conversion receiver is one of the following: a DVB-T (Digital Video Broadcasting-Terrestrial) direct conversion receiver, an ISDB-T (Integrated Services Digital Broadcasting-Terrestrial) direct conversion receiver.

12. An IQ-based (In-phase and Quadrature) direct conversion receiver for correcting an IQ-imbalance the direct conversion receiver comprising:
- a radio frequency part for receiving a radio frequency signal in the direct conversion receiver, the radio frequency signal being received from an antenna;
- an in-phase branch and a quadrature-phase branch, in an analogue domain of the direct conversion receiver, for conveying the received radio frequency signal in the in-phase branch and the quadrature-phase branch;
- a first mixer for mixing, in the analogue domain of the direct conversion receiver, the radio frequency signal of the in-phase branch with a first mixing signal to form a baseband in-phase (I) signal component and second mixer for mixing, in the analogue domain of the direct conversion receiver, the radio frequency signal of the quadrature-phase branch with a second mixing signal to form a baseband quadrature-phase (Q) signal component;
- a digital demodulator adapted to receive the baseband in-phase (I) signal component and the baseband quadrature-phase (Q) signal component, the digital demodulator being adapted to detect the IQ-imbalance of the direct conversion receiver by analysing at least one of the baseband in-phase (I) or quadrature-phase (Q) signal components; and
- means for correcting the IQ-imbalance, detected in the digital demodulator, in the analogue domain of the direct conversion receiver to achieve at least close to a 90 degrees phase difference between a future baseband in-phase signal component and a fixture baseband quadrature-phase signal component.

13. A communication device comprising an IQ-based (In-phase and Quadrature) direct conversion receiver for correcting an IQ-imbalance the direct conversion receiver comprising:
- a radio frequency part for receiving a radio frequency signal in the direct conversion receiver, the radio frequency signal being received from an antenna;
- an in-phase branch and a quadrature-phase branch, in an analogue domain of the direct conversion receiver, for conveying the received radio frequency signal in the in-phase branch and the quadrature-phase branch;
- a first mixer for mixing, in the analogue domain of the direct conversion receiver, the radio frequency signal of the in-phase branch with a first mixing signal to form a baseband in-phase (I) signal component and second mixer for mixing, in the analogue domain of the direct conversion receiver, the radio frequency signal of the quadrature-phase branch with a second mixing signal to form a baseband quadrature-phase (Q) signal component;
- a digital demodulator adapted to receive the baseband in-phase (I) signal component and the baseband quadrature-phase (Q) signal component, the digital demodulator being adapted to detect the IQ-imbalance of the direct conversion receiver by analysing at least one of the baseband in-phase (I) or quadrature-phase (Q) signal components; and
- means for correcting the IQ-imbalance, detected in the digital demodulator, in the analogue domain of the direct conversion receiver to achieve at least close to a 90 degrees phase difference between a future baseband in-phase signal component and a future baseband quadrature-phase signal component.

14. A communication device according to claim 13, wherein the communication device comprises, in addition to the direct conversion receiver, a cellular network interface for communicating information with a cellular network.

15. A system comprising a transmitter and an IQ-based (In-phase and Quadrature) direct conversion receiver for correcting an IQ-imbalance, the transmitter comprising a modulator for transmitting a radio frequency signal to the direct conversion receiver the direct conversion receiver comprising:
- a radio frequency part for receiving the radio frequency signal in the direct conversion receiver, the radio frequency signal being received from an antenna;
- an in-phase branch and a quadrature-phase branch, in an analogue domain of the direct conversion receiver, for conveying the received radio frequency signal in the in-phase branch and the quadrature-phase branch;
- a first mixer for mixing, in the analogue domain of the direct conversion receiver, the radio frequency signal of the in-phase branch with a first mixing signal to form a baseband in-phase (I) signal component and second mixer for mixing, in the analogue domain of the direct conversion receiver, the radio frequency signal of the quadrature-phase branch with a second mixing signal to form a baseband quadrature-phase (Q) signal component;
- a digital demodulator adapted to receive the baseband in-phase (I) signal component and the baseband quadrature-phase (Q) signal component, the digital demodulator being adapted to detect the IQ-imbalance of the direct conversion receiver by analysing at least one of the baseband in-phase (I) or quadrature-phase (Q) signal components;
- means for correcting the IQ-imbalance, detected in the digital demodulator, in the analogue domain of the direct conversion receiver to achieve at least close to a 90 degrees phase difference between a future baseband in-phase signal component and a future baseband quadrature-phase signal component.

* * * * *

UNITED STATES PATENT AND TRADEMARK OFFICE
CERTIFICATE OF CORRECTION

| | | |
|---|---|---|
| PATENT NO. | : 7,336,730 B2 | Page 1 of 1 |
| APPLICATION NO. | : 10/482254 | |
| DATED | : February 26, 2008 | |
| INVENTOR(S) | : Auranen et al. | |

It is certified that error appears in the above-identified patent and that said Letters Patent is hereby corrected as shown below:

Column 11,

Line 33, "fixture" should read --future--.

Signed and Sealed this

Fifteenth Day of July, 2008

JON W. DUDAS
*Director of the United States Patent and Trademark Office*